(12) United States Patent
Park et al.

(10) Patent No.: US 10,068,630 B2
(45) Date of Patent: Sep. 4, 2018

(54) NON-VOLATILE FERROELECTRIC MEMORY CELLS WITH MULTILEVEL OPERATION

(71) Applicant: SABIC Global Technologies B.V., Bergen op Zoom (NL)

(72) Inventors: Ji Hoon Park, Thuwal (SA); Husam N. Alshareef, Thuwal (SA); Mohd A. Khan, Thuwal (SA); Ihab N. Odeh, Thuwal (SA)

(73) Assignee: SABIC Global Technologies B.V., Amsterdam (NL)

( * ) Notice: Subject to any disclaimer, the term of this patent is extended or adjusted under 35 U.S.C. 154(b) by 0 days.

(21) Appl. No.: 15/324,319

(22) PCT Filed: Jun. 3, 2015

(86) PCT No.: PCT/US2015/033983
§ 371 (c)(1),
(2) Date: Jan. 6, 2017

(87) PCT Pub. No.: WO2016/028356
PCT Pub. Date: Feb. 25, 2016

(65) Prior Publication Data
US 2017/0249983 A1   Aug. 31, 2017

Related U.S. Application Data

(60) Provisional application No. 62/039,229, filed on Aug. 19, 2014.

(51) Int. Cl.
*G11C 11/22* (2006.01)
*G11C 11/56* (2006.01)
*H01L 27/11509* (2017.01)

(52) U.S. Cl.
CPC ........ *G11C 11/2275* (2013.01); *G11C 11/221* (2013.01); *G11C 11/2273* (2013.01);
(Continued)

(58) Field of Classification Search
CPC .............. G11C 11/221; G11C 11/2273; G11C 11/2275; G11C 11/2277; G11C 11/5657; H01L 27/11509
See application file for complete search history.

(56) References Cited

U.S. PATENT DOCUMENTS

| 5,541,422 A | * | 7/1996 | Wolf | ........................ G11C 11/22 257/295 |
| 6,870,753 B2 | * | 3/2005 | Hamada | .............. G11C 11/5657 365/145 |

(Continued)

FOREIGN PATENT DOCUMENTS

| CN | 101620879 A | 4/2010 |
| CN | 102257610 A | 11/2011 |

(Continued)

OTHER PUBLICATIONS

Notice of Reasons for Rejection issued for JP2016-571695, dated Jun. 8, 2017.

(Continued)

*Primary Examiner* — Vanthu Nguyen
(74) *Attorney, Agent, or Firm* — Norton Rose Fulbright US LLP

(57) ABSTRACT

Ferroelectric components, such as the ferroelectric field effect transistors (FeFETs), ferroelectric capacitors and ferroelectric diodes described above may be operated as multi-level memory cells as described by the present invention. Storing multiple bits of information in each multi-level memory cell may be performed by a controller coupled to an array of the ferroelectric components configured as ferro- (Continued)

electric memory cells. The controller may execute the steps of receiving a bit pattern for writing to a multi-level memory cell comprising a ferroelectric layer; selecting a pulse duration for applying a write pulse to the memory cell based, at least in part, on the received bit pattern; and applying at least one write pulse to the memory cell having the selected pulse duration, in which the at least one write pulse creates a remnant polarization within the ferroelectric layer that is representative of the received bit pattern.

11 Claims, 13 Drawing Sheets

(52) U.S. Cl.
CPC ...... *G11C 11/2277* (2013.01); *G11C 11/5657* (2013.01); *H01L 27/11509* (2013.01)

(56) References Cited

U.S. PATENT DOCUMENTS

| | | | | |
|---|---|---|---|---|
| 6,995,998 | B2* | 2/2006 | Kang | G11C 11/5657 365/145 |
| 7,254,059 | B2 | 8/2007 | Li et al. | 365/185.03 |
| 7,820,311 | B2* | 10/2010 | Ko | G11B 9/02 257/288 |
| 8,188,517 | B2 | 5/2012 | Choi | 257/211 |
| 8,288,264 | B2 | 10/2012 | Bhattacharyya | 438/591 |
| 8,547,741 | B2 | 10/2013 | Lue et al. | 365/185.05 |
| 8,597,976 | B2 | 12/2013 | Ho et al. | 438/104 |
| 8,633,465 | B2 | 1/2014 | Huang et al. | 257/4 |
| 9,318,596 | B2* | 4/2016 | Fabiano | H01L 29/78 |
| 2004/0080990 | A1 | 4/2004 | Hamada | 365/200 |
| 2007/0008769 | A1 | 1/2007 | Kim et al. | 365/148 |
| 2007/0045711 | A1 | 3/2007 | Bhattacharyya | 257/315 |
| 2009/0097311 | A1 | 4/2009 | Roohparvar et al. | 365/185.03 |
| 2009/0290404 | A1 | 11/2009 | Kaneko et al. | 365/145 |
| 2010/0073988 | A1 | 3/2010 | Takahashi et al. | 365/145 |
| 2011/0170330 | A1 | 7/2011 | Oezyilmaz et al. | 365/145 |
| 2012/0195094 | A1* | 8/2012 | Greco | G11C 11/22 365/145 |
| 2013/0051164 | A1 | 2/2013 | Chang et al. | 365/189.16 |
| 2013/0127011 | A1 | 5/2013 | Higashitani et al. | 257/532 |
| 2013/0272069 | A1 | 10/2013 | Rabkin et al. | 365/185.17 |
| 2013/0273700 | A1 | 10/2013 | Rabkin et al. | 438/158 |

FOREIGN PATENT DOCUMENTS

| | | |
|---|---|---|
| EP | 1403876 A1 | 3/2004 |
| JP | 09161473 A | 6/1997 |
| JP | 3275216 B2 | 4/2002 |
| JP | 3360471 B2 | 12/2002 |
| JP | 2004288276 A | 10/2004 |
| KR | 2014026698 A | 3/2014 |
| WO | WO 2009048898 | 4/2009 |
| WO | WO 2013032257 | 3/2013 |

OTHER PUBLICATIONS

Hwang et al., *Advanced Functional Materials* 23.44 (2013): 5484-5493.
Hwang et al., *Advanced Materials* 24.44 (2012): 5910-5914.
International Preliminary Report on Patentability for PCT/US2015/033983, dated Nov. 14, 2016.
International Search Report and Written Opinion for PCT/US2015/033983, dated Oct. 6, 2015.
Orihara et al., *J. Phys. Soc. Jpn.* 63 (1994): 1031-1035.
Yoon et al., *Japanese Journal of Applied Physics* 49.45 (2010): 04DJ06.
Extended European Search Report and Opinion for EP15834150.3 dated Oct. 4, 2017.
First Office Action for CN 201580043366.X, dated Jul. 5, 2017.

* cited by examiner

NON-VOLATILE FERROELECTRIC MEMORY CELLS WITH MULTILEVEL OPERATION

CROSS REFERENCE TO RELATED APPLICATIONS

This application is a national phase application under 35 U.S.C. § 371 of International Application No. PCT/US2015/033983 filed Jun. 3, 2015, which claims benefit to U.S. Provisional Application No. 62/039,229 titled "NON-VOLATILE FERROELECTRIC MEMORY CELLS WITH MULTILEVEL OPERATION" filed Aug. 19, 2014. The entire contents of each of the above-referenced patent applications are incorporated into the present application by reference without disclaimer.

BACKGROUND OF THE INVENTION

A. Field of the Invention

The present disclosure generally relates to the operation of electronic devices and components with polymeric ferroelectric materials that can be used in nonvolatile memory and energy storage applications.

B. Description of Related Art

Memory systems are used for storage of data, program code, and/or other information in many electronic products, such as personal computer systems, embedded processor-based systems, video image processing circuits, portable phones, and the like. Important characteristics for a memory cell in electronic device are low cost, nonvolatility, high density, writability, low power, and high speed. Conventional memory solutions include Read Only Memory (ROM), Programmable Read only Memory (PROM), Electrically Programmable Memory (EPROM), Electrically Erasable Programmable Read Only Memory (EEPROM), Dynamic Random Access Memory (DRAM) and Static Random Access Memory (SRAM).

ROM is relatively low cost but cannot be rewritten. PROM can be electrically programmed but with only a single write cycle. EPROM has read cycles that are fast relative to ROM and PROM read cycles, but has relatively long erase times and reliability only over a few iterative read/write cycles. EEPROM (or "Flash") is inexpensive, and has low power consumption but has long write cycles (ms) and low relative speed in comparison to DRAM or SRAM. Flash also has a finite number of read/write cycles leading to low long-term reliability. ROM, PROM, EPROM and EEPROM are all non-volatile, meaning that if power to the memory is interrupted the memory will retain the information stored in the memory cells.

DRAM stores charge on transistor gates that act as capacitors but must be electrically refreshed every few milliseconds complicating system design by requiring separate circuitry to "refresh" the memory contents before the capacitors discharge. SRAM does not need to be refreshed and is fast relative to DRAM, but has lower density and is more expensive relative to DRAM. Both SRAM and DRAM are volatile, meaning that if power to the memory is interrupted the memory will lose the information stored in the memory cells.

Consequently, existing technologies are either non-volatile but are not randomly accessible and have low density, high cost, and limited ability to allow multiples writes with high reliability of the circuit's function, or they are volatile and complicate system design or have low density. Some technologies have attempted to address these shortcomings including ferromagnetic RAM (FRAM) which utilize a ferromagnetic region of a ferroelectric capacitor or thin film transistor to generate a nonvolatile memory cell.

These capacitors and thin film transistors may include a ferroelectric polymer layer. The ferroelectric polymer layer is essentially a thin layer of insulating film which contains a permanent electrical polarization that can be reversed repeatedly, by an opposing electric field. As a result, ferroelectric memory components and devices have two possible non-volatile states, which they can retain without electrical power, corresponding to the two binary logic levels in a digital memory. Ferroelectric memory devices frequently use polyvinylidene fluoride (PVDF) or polyvinylidene fluoride (PVDF-TrFE) copolymer as the ferroelectric material due to its large polarization value and electrical and material properties.

Ferroelectric capacitors also provide energy-storing functionality. When a voltage is applied across the plates, the electric field in the ferroelectric material displaces electric charges, and thus stores energy. The amount of energy stored depends on the dielectric constant of the insulating material and the dimensions (total area and thickness) of the film, such that in order to maximize the total amount of energy that a capacitor or transistor can accumulate, the dielectric constant and breakdown voltage of the film are maximized, and the thickness of the film minimized.

While ferroelectric memory devices address many of the important characteristics for a memory cell and energy storage, they can be expensive, time-consuming, and complicated to make. Thus, for example in memory devices, the cost per storage bit of ferroelectric devices versus conventional electronic devices is much higher.

SUMMARY OF THE INVENTION

Ferroelectric components and devices, such as the ferroelectric field effect transistors (FeFETs), ferroelectric capacitors, and ferroelectric diodes may be operated as multi-level memory cells as described by the present invention. Storing multiple bits of information in each multi-level memory cell may increase the density of data stored in a memory device and thus allow smaller and/or higher capacity memory devices to be constructed at reduced costs. Conventionally, a single ferroelectric memory cell may store a single bit of information, e.g., '1' or '0.' This '1' or '0' value may be stored as a binary polarization direction of the ferroelectric layer in the ferroelectric component. For example, when the ferroelectric layer is polarized from top to bottom, the ferroelectric component stores a '1', and when the ferroelectric layer is polarized from bottom to top, the ferroelectric component stores a '0.' A multi-level memory cell (MLC) as disclosed in the present invention store, in a single ferroelectric component, two or more bits of information, e.g., '00,' '01,' '10,' or '11.' In one embodiment, the multiple bits of information may be represented by varying levels of polarization of the ferroelectric material, which is achieved by varying the pulse of applied voltage to the ferroelectric material. That is, a highly polarized ferroelectric layer may represent '00,' a less polarized layer may represent '01,' a further reduced polarization layer may represent '10,' and a near zero or zero polarization layer may represent '11.' This mapping of polarization states is only one example, the different polarization levels may represent different bit combinations in different embodiments of the present invention.

In one aspect of the present invention there is disclosed a method for storing multiple bits of information in a multilevel ferroelectric memory cell having ferroelectric material, the method comprising receiving a bit pattern for writing to a multi-level memory cell comprising a ferroelectric layer; selecting a pulse duration for applying a write pulse to the memory cell based, at least in part, on the received bit pattern; and applying at least one write pulse to the memory cell having the selected pulse duration, in which the at least one write pulse creates a remnant polarization within the ferroelectric layer that is representative of the received bit pattern.

In another aspect of the present invention there is disclosed an apparatus, such as a memory device having at least one ferroelectric capacitor, ferroelectric thin film transistor or ferroelectric diode. The apparatus may also include a controller coupled to the gate of the memory cell and configured to perform the steps of receiving a bit pattern for writing to the memory cell; selecting a pulse duration for applying a write pulse to the memory cell based, at least in part, on the received bit pattern; and applying at least one write pulse to the memory cell having the selected pulse duration, in which the at least one write pulse creates a remnant polarization within the ferroelectric layer that is representative of the received bit pattern.

In a further aspect of the present invention there is disclosed an apparatus comprising a memory cell, such as a ferroelectric diode, and a controller coupled to the memory cell. The memory cell may include an upper electrode, a lower electrode, and a blend of ferroelectric and semiconducting material between lower and upper electrode. The controller may be configured to perform the steps of receiving a bit pattern for writing to the memory cell, selecting a pulse duration for applying a write pulse to the memory cell based, at least in part, on the received bit pattern, and applying at least one write pulse to the memory cell having the selected pulse duration, in which the at least one write pulse creates a remnant polarization within the ferroelectric layer that is representative of the received bit pattern.

Also disclosed in the context of the present invention are embodiments 1 to 33. Embodiment 1 is a method that includes a) receiving a bit pattern for writing to a multi-level memory cell that includes a ferroelectric layer; b) selecting a pulse duration for applying a write pulse to the memory cell based, at least in part, on the received bit pattern; and c) applying at least one write pulse to the memory cell having the selected pulse duration, in which the at least one write pulse creates a remnant polarization within the ferroelectric layer that is representative of the received bit pattern. Embodiment 2 is the method of embodiment 1, in which the step of applying the at least one write pulse to the memory cell includes applying the at least one write pulse to a ferroelectric field-effect transistor (Fe-FET). Embodiment 3 is the method of embodiment 2, in which the step of applying the at least one write pulse to the memory cell comprises applying the at least one write pulse to a multi-level memory cell that includes a ferroelectric polymer. Embodiment 4 is the method of embodiment 2, in which the step of applying the at least one write pulse to the memory cell to create the remnant polarization within the ferroelectric layer includes modifying a channel resistance between a drain and a source of the Fe-FET, wherein the channel resistance between the drain and the source is representative of the received bit pattern. Embodiment 5 is the method of embodiment 1, in which the step of applying the at least one write pulse to the memory cell comprises applying at least one write pulse to a ferroelectric diode. Embodiment 6 is the method of embodiment 5, in which the step of applying the at least one write pulse to the memory cell to create the remnant polarization within the ferroelectric layer includes modifying a channel resistance between an upper and a lower electrode in a diode, wherein the channel resistance between the upper and the lower electrode is representative of the received bit pattern. Embodiment 7 is the method of embodiment 1, in which the step of applying the at least one write pulse to the memory cell comprises applying a plurality of write pulses to the memory cell at a frequency based, at least in part, on the received bit pattern. Embodiment 8 is the method of embodiment 1, in which the step of receiving the bit pattern comprises receiving at least two bits. Embodiment 9 is the method of embodiment 1 that further includes sensing a channel resistance of a second multi-level memory cell having a ferroelectric layer; and determining a second bit pattern stored in the second multi-level memory cell based, at least in part, on the sensed resistance. Embodiment 10 is the method of embodiment 9, wherein the sensed resistance of the second multi-level memory cell is representative of the remnant polarization of the ferroelectric layer. Embodiment 11 is the method of embodiment 10, wherein the second multi-level memory cell is the first multi-level memory cell, and the method further includes verifying the determined second bit pattern is the received bit pattern.

Embodiment 12 is an apparatus that includes (a) a memory cell that includes: i. a source; ii. a drain; iii. a channel between the source and the drain; iv. a ferroelectric layer on or under the channel; v. a gate on or under the ferroelectric layer; and (b) a controller coupled to the gate of the memory cell and configured to perform the steps of: i. receiving a bit pattern for writing to the memory cell; ii. selecting a pulse duration for applying a write pulse to the memory cell based, at least in part, on the received bit pattern; and iii. applying at least one write pulse to the memory cell having the selected pulse duration, in which the at least one write pulse creates a remnant polarization within the ferroelectric layer that is representative of the received bit pattern. Embodiment 13 is the apparatus of embodiment 12, in which the controller is configured to create a conduction path in the channel by applying the at least one write pulse to the memory cell based, at least in part, on the pulse duration of the at least one write pulse. Embodiment 14 is the apparatus of embodiment 13, in which the controller is configured to set a charge carrier level in the conduction channel by applying the at least one write pulse to the memory cell based, at least in part, on the pulse duration of the at least one write pulse. Embodiment 15 is the apparatus of embodiment 12, in which the controller is configured to receive at least two bits in the received bit pattern. Embodiment 16 is the apparatus of embodiment 12 that further includes a substrate on which the memory cell is constructed, in which the memory cell is configured in a top-gate structure having the gate on a side of the memory cell facing away from the substrate. Embodiment 17 is the apparatus of embodiment 12, further including a substrate on which the memory cell is constructed, in which the memory cell is configured in a bottom-gate structure having the gate on a side of the memory cell facing towards the substrate. Embodiment 18 is the apparatus of embodiment 12, in which the ferroelectric layer includes an organic ferroelectric. Embodiment 19 is the apparatus of embodiment 12, in which the memory cell is one memory cell of an array of memory cells. Embodiment 20 is the apparatus of embodiment 19, further including: a word line coupled to the gate of the memory cell and coupled to the controller, wherein the controller is configured to apply the at least one write pulse of the pulse duration to the gate of the memory cell through the word line. Embodiment 21 is the apparatus of embodiment 19, further including: a bit line coupled to at least one of the drain and source of the memory cell; and a sense amplifier coupled to the bit line, wherein the controller is further configured to perform the steps of: i. detecting a current through the memory cell sensed by the sense amplifier; and ii. determining a bit pattern representative of the detected current. Embodiment 22 is the apparatus of embodiment 21, wherein the controller is configured to verify the determined bit pattern is equal to the received bit pattern. Embodiment 23 is the apparatus of embodiment 12, in which the memory cell is a ferroelectric field-effect transistor (Fe-FET).

Embodiment 24 is an apparatus that includes a) a memory cell that includes an upper electrode; ii. a lower electrode; iii. a blend of ferroelectric and semiconducting material between lower and upper electrode; and b) a controller coupled to the memory cell and configured to perform the steps of: i. receiving a bit pattern for writing to the memory cell; ii. selecting a pulse duration for applying a write pulse to the memory cell based, at least in part, on the received bit pattern; and iii. applying at least one write pulse to the memory cell having the selected pulse duration, in which the at least one write pulse creates a remnant polarization within the ferroelectric layer that is representative of the received bit pattern. Embodiment 25 is the apparatus of embodiment 24, in which the controller is configured to create a conduction channel in the blend layer by applying the at least one write pulse to the memory cell based, at least in part, on the pulse duration of the at least one write pulse. Embodiment 26 is the apparatus of embodiment 25, in which the controller is configured to set a charge carrier level in the blend layer by applying the at least one write pulse to the memory cell based, at least in part, on the pulse duration of the at least one write pulse. Embodiment 27 is the apparatus of embodiment 24, in which the controller is configured to receive at least two bits in the received bit pattern. Embodiment 28 is the apparatus of embodiment 24, further comprising a substrate on which the memory cell is constructed. Embodiment 29 is the apparatus of embodiment 24, in which the ferroelectric layer comprises an organic ferroelectric. Embodiment 30 is the apparatus of embodiment 24, in which the semiconductor layer includes a polymeric semiconductor, oxide semiconductor, small molecule or any inorganic semiconductor. Embodiment 31 is the embodiment of claim 24, in which the memory cell is one memory cell of an array of memory cells.

Embodiment 32 is an apparatus that includes: a memory cell that includes: i. a source; ii. a drain; iii. a channel between the source and the drain; iv. a ferroelectric layer on or under the channel; and v. a gate on or under the ferroelectric layer; b) means for receiving a bit pattern for writing to the memory cell, the receiving means coupled to the memory cell; c) means for selecting a pulse duration for applying a write pulse to the memory cell based, at least in part, on the received bit pattern, the receiving means coupled to the memory cell and to the receiving means; and d) means for applying at least one write pulse to the memory cell having the selected pulse duration, in which the at least one write pulse creates a remnant polarization within the ferroelectric layer that is representative of the received bit pattern, the applying means coupled to the memory cell and to the selecting means.

Embodiment 33 is an apparatus that includes a) a memory cell that includes i. an upper electrode; ii. a lower electrode; and iii. a blend of ferroelectric and semiconducting material between lower and upper electrode; b) means for receiving a bit pattern for writing to the memory cell, the receiving means coupled to the memory cell; c) means for selecting a pulse duration for applying a write pulse to the memory cell based, at least in part, on the received bit pattern, the selecting means coupled to the receiving means and to the memory cell; and d) means for applying at least one write pulse to the memory cell having the selected pulse duration, in which the at least one write pulse creates a remnant polarization within the ferroelectric layer that is representative of the received bit pattern, the applying means coupled to the selecting means and the memory cell.

The phrase "polymer blend" includes at least two polymers that have been blended together by any of the known techniques for producing polymer blends. Such techniques include solution blending using a common solvent or melt blend extrusion whereby the components are blended at temperatures above the melting point of the polymers and the obtained mixture is subsequently extruded into granules or directly into sheets or any other suitable form. Screw extruders or mills are commonly used for melt blending polymers. It will also be appreciated the blend of polymers may be a simple powder blend providing that the blend is subjected to a homogenizing process before or during the process of fabricating the ferroelectric material of the present invention. Thus, for example, where a ferroelectric material is formed from at least two polymers in a screw-fed injection-molding machine, the feed to the hopper of the screw may be a simple mixture of the two polymers since a blend may be achieved in the screw portion of the machine.

The term "polymer" includes oligomers (e.g., a polymer having 2 to 10 monomeric units or 2 to 5 monomeric units) and polymers (e.g., a polymer having greater than 10 monomeric units). The polymer can be a homopolymer, a copolymer, a terpolymer, or a higher multi-monomer composition, or blends thereof.

The term "ferroelectric material" includes all materials, both organic and inorganic, that exhibit ferroelectric properties, such as retaining a remnant electric field polarization at zero applied electric field.

The term "about" or "approximately" are defined as being close to as understood by one of ordinary skill in the art, and in one non-limiting embodiment the terms are defined to be within 10%, preferably within 5%, more preferably within 1%, and most preferably within 0.5%.

The use of the word "a" or "an" when used in conjunction with the term "comprising" in the claims or the specification may mean "one," but it is also consistent with the meaning of "one or more," "at least one," and "one or more than one."

The words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "coupled" is defined as connected, although not necessarily directly, and not necessarily mechanically.

The processes of the present invention can "comprise," "consist essentially of," or "consist of" particular steps disclosed throughout the specification.

Other objects, features and advantages of the present invention will become apparent from the following figures, detailed description, and examples. It should be understood, however, that the figures, detailed description, and examples, while indicating specific embodiments of the invention, are given by way of illustration only and are not meant to be limiting. Additionally, it is contemplated that changes and modifications within the spirit and scope of the invention will become apparent to those skilled in the art from this detailed description.

DETAILED DESCRIPTION OF THE INVENTION

The current memory devices based on ferroelectric materials have high costs associated with manufacturing compared to conventional memory devices. The present invention overcomes the current difficulties associated with manufacturing ferroelectric memory devices. To reduce the cost of the memory devices, each cell of the memory device may be controlled to store multiple bits of information, rather than a single bit of information as in conventional ferroelectric memory devices. Thus, the size of a ferroelectric memory device may be reduced while maintaining the same total information storage. For example, a single-level ferroelectric memory device may normally require a die size of 10 $mm^2$×10 $mm^2$ to store 1 GB of information. However, a multi-level ferroelectric memory device operated such that each memory cell in the device stores two bits of information may allow construction of a 1 GB memory chip with a die size of only approximately 7 $mm^2$×7 $mm^2$.

These and other non-limiting aspects of the present invention are discussed in further detail in the following sections.

A. Ferroelectric Capacitors and Thin Film Transistors and Diodes

Figure 1A:
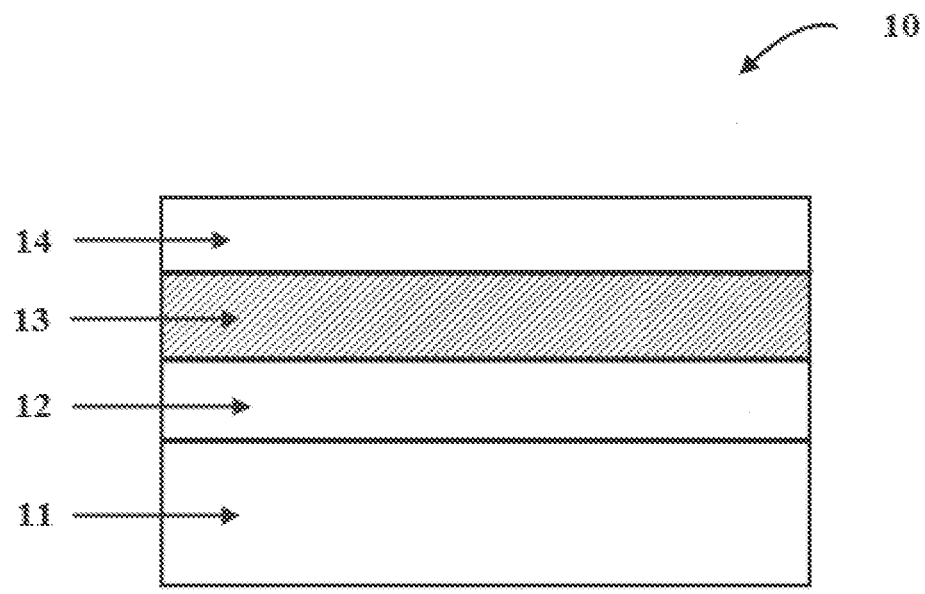
FIG. 1A: Illustration of a single ferroelectric capacitor that can be controlled through the processes and apparatuses of the present invention.
Figure 1B:
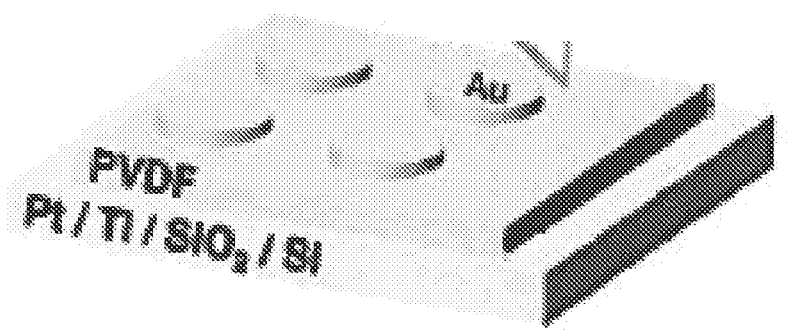
FIG. 1B: Illustration of an array of ferroelectric capacitors that may be used to store information according to the processes and apparatuses of the present invention.
Figure 2A:
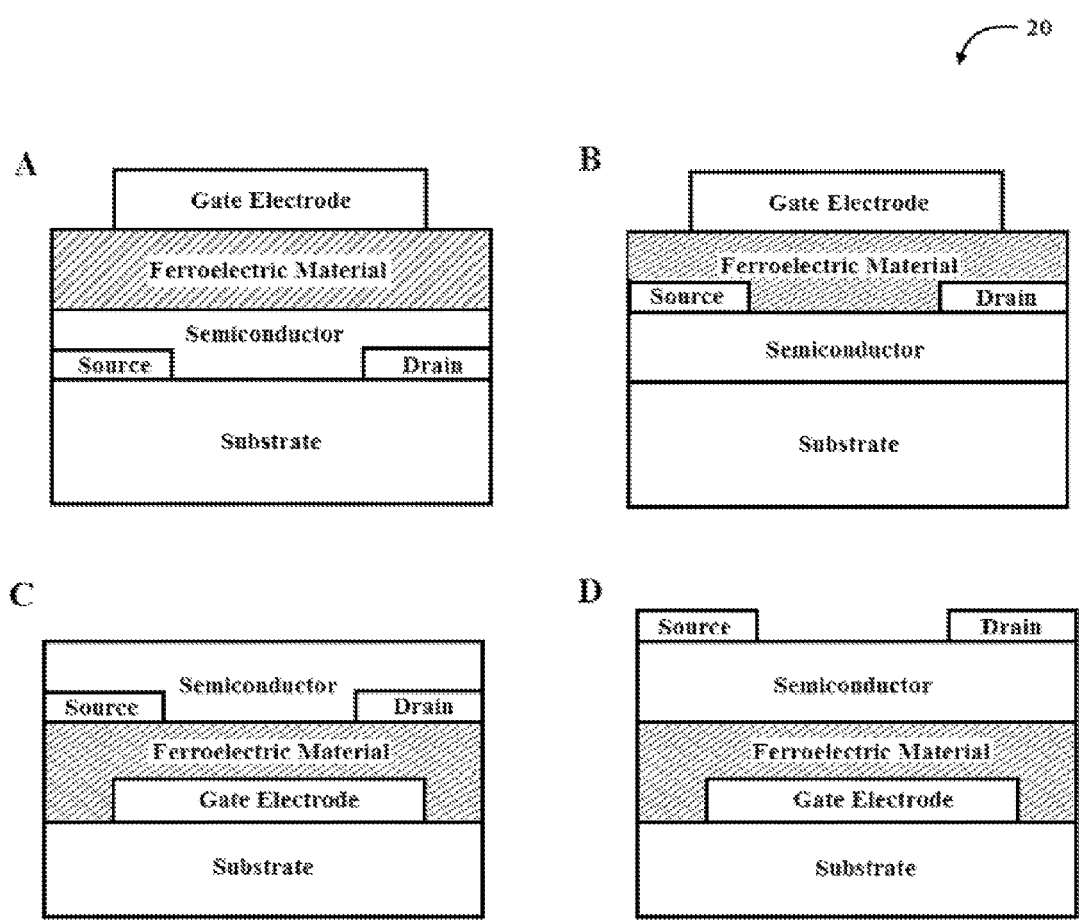
FIG. 2A: Illustration of various ferroelectric thin film transistors that can be controlled through the processes and apparatuses of the present invention.
Figure 2B:
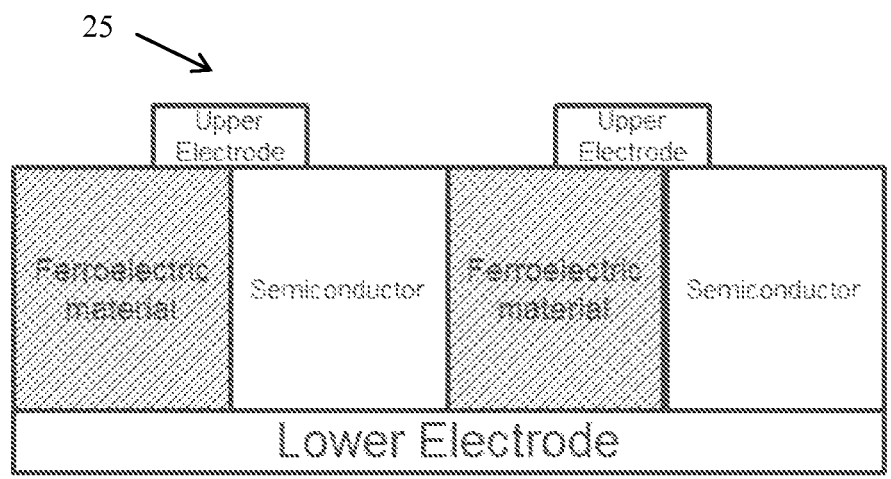
FIG. 2B: Illustration of various ferroelectric diodes that can be controlled through the processes and apparatuses of the present invention.

FIGS. 1A, 1B, 2A, and 2B each provide a view of ferroelectric components, including ferroelectric capacitors and thin film transistors (field effect transistors with varying set-ups in (A), (B), (C), and (D) of FIG. 2A), respectively, that can be integrated into a memory device and operated by a memory controller or other device according to the methods of the present invention. Before discussing the processes of the present invention, a description of some of the components that can be used to make ferroelectric capacitors and thin film transistors is provided. With reference to FIG. 1A, the ferroelectric capacitor (10) includes a ferroelectric material (13) that is annealed, in one embodiment, with pulsed light, or in another embodiment, with heat. The shading used for the ferroelectric material (13) refers to precursor material that has been transformed into ferroelectric material having hysteresis properties. For the purposes of FIG. 1A, the ferroelectric material (13) is illustrated in the form of a film or layer. The ferroelectric capacitor (10) can include a substrate (11), a lower electrode (12), a ferroelectric material (13), and an end electrode (14). The ferroelectric capacitor (10) can be fabricated on substrates by sandwiching a ferroelectric material (13) between two conducting electrodes (12) and (14). Additional materials, layers, and coatings (not shown) known to those of ordinary skill in the art can be used with the ferroelectric capacitor (10), some of which are described below. An array of ferroelectric components, including capacitors, may be manufactured by patterning, for example, the end electrode 14 as shown in FIG. 1B. Other ferroelectric components that may be used to form memory arrays may be ferroelectric field effect transistors (FeFETs), such as shown in FIG. 2A. FIG. 2A represents various configurations of thin film transistors (20) that can be integrated into a memory device of the present invention. Other ferroelectric components that may be used to form memory arrays may be ferroelectric diodes, such as shown in FIG. 2B FIG. 2B represents a configuration of ferroelectric diodes (25). A ferroelectric diode may include an upper electrode and a lower electrode separated by a layer of alternating ferroelectric material and semiconductor material. The ferroelectric material portion may include a blend of ferroelectric and semiconductor material.

The ferroelectric capacitor in FIGS. 1A-B, thin film transistors in FIG. 2A and diodes in FIG. 2B are said to have "memory" because, at zero volts, they have two polarization states that do not decay back to zero. These polarization states can be used to represent a stored value, such as binary 0 or 1, and are read by applying an electric field. The amount of charge needed to flip the polarization state to the opposite state can be measured and the previous polarization state is revealed. In the case of ferroelectric capacitors, this means that the read operation changes the polarization state, and can be followed by a corresponding write operation, in order to write back the stored value by again altering the polarization state.

1. Substrate (10)

The substrate (10) is used as support. It is typically made from material that is not easily altered or degraded by heat or organic solvents. Non-limiting examples of such materials include inorganic materials such as silicon, plastic, paper, banknotes as well as SABIC substrates including polyethylene terephthalate, polycarbonates, poly(methyl methacrylates), or polyetherimides, or polymeric blends comprising such polymers. The memory cells described herein may be produced on all types of substrates, including those that have low glass transition temperatures ($T_g$) (e.g., polyethylene terephthalate (PET), polyethylene (PE), polyvinyl chloride (PVC), polystyrene (PS), or polypropylene (PP)).

2. Lower Electrode and Upper Electrodes (12) and (14)

Staying with FIG. 1A, the lower electrode (12) can be made of a conductive material. Typically, the lower electrode (12) can be obtained by forming a film using such a material (e.g., vacuum deposition, sputtering, ion-plating, plating, coating, etc.). Non-limiting examples of conductive material that can be used to form a film include gold, platinum, silver, aluminum and copper, iridium, iridium oxide, and the like. In addition, non-limiting examples of conductive polymer materials include conducting polymers (such as PEDOT: PSS, Polyaniline, graphene etc.), and polymers made conductive by inclusion of conductive micro- or nano-structures (such as silver nanowires). The thickness of the film for the lower electrode (12) is typically between 20 nm to 500 nm, although other sizes and ranges are contemplated for use in the context of the present invention.

The upper electrode (14) can be disposed on the ferroelectric material (13) by thermally evaporating through a shadow mask. The material used for the upper electrode (14) can be conductive. Non-limiting examples of such materials include metals, metal oxides, and conductive polymers (e.g., polyaniline, polythiophene, etc.) and polymers made conductive by inclusion of conductive micro- or nano-structures such as those discussed above in the context of the lower electrode (12). The upper electrode (14) can be a single layer or laminated layers formed of materials each having a different work function. Further, it may be an alloy of one or more of the materials having a low work function and at least one selected from the group consisting of gold, silver, platinum, copper, manganese, titanium, cobalt, nickel, tungsten, and tin. Examples of the alloy include a lithium-aluminum alloy, a lithium-magnesium alloy, a lithium-indium alloy, a magnesium-silver alloy, a magnesium-indium alloy, a magnesium-aluminum alloy, an indium-silver alloy, and a calcium-aluminum alloy. The film thickness of the upper electrode (14) is typically between 20 nm to 500 nm, although other sizes and ranges are contemplated for use in the context of the present invention.

3. Ferroelectric Material (13)

Continuing with FIG. 1A, the ferroelectric material (13) can be interposed between the lower electrode (12) and the upper electrode (14). In one instance, the material (13) can be obtained from a ferroelectric precursor material (see FIG. 3, element (34)), which can include a ferroelectric polymer, copolymer, terpolymer, or a polymer blend comprising a ferroelectric polymer, copolymer, or terpolymer or combinations thereof. In preferred aspects, the polymers in the precursor material (34) are solubilized in a solvent or melt such that they do not exhibit ferroelectric hysteresis properties but can be transformed via annealing by, for example heat, to exhibit ferroelectric hysteresis properties. A discussion on this process is provided below. Non-limiting examples of ferroelectric polymers include polyvinylidene fluoride (PVDF)-based polymers, polyundecanoamide (Nylon 11)-based polymers, or blends of PVDF-based polymers or polyundecanoamide (Nylon 11)-based polymers. The PVDF-based polymer can be a homopolymer, a copolymer, or a terpolymer, or a blend thereof. A non-limiting example of a PVDF-based homopolymer polymer is PVDF. Non-limiting examples of PVDF-based copolymers are poly(vinylidene fluoride-tetrafluoroethylene) (P(VDF-TrFE)), poly(vinylidene-fluoride-co-hexafluoropropene) (P(VDF-HFP)), poly(vinylidene-fluoride-chlorotrifluoroethylene) (P(VDF-CTFE)) or poly(vinylidene-fluoride-chlorofluoroethylene) (P(VDF-CFE)). Non-limiting examples of PVDF-based terpolymers include poly(vinylidene-fluoride-trifluoroethylene-chlorotrifluoroethylene) (P(VDF-TrFE-CTFE)) or poly(vinylidene-fluoride-trifluoroethylene-chlorofluoroethylene) (P(VDF-TrFE-CFE)). The ferroelectric polymer can be blended with a non-ferroelectric polymer. Examples of non-ferroelectric polymers include a poly(phenylene oxide) (PPO), a polystyrene (PS), or a poly(methyl methacrylate) (PMMA), or blends thereof. In some instances, steps (a) and (b) are performed in a roll-to-roll process.

Figure 3:
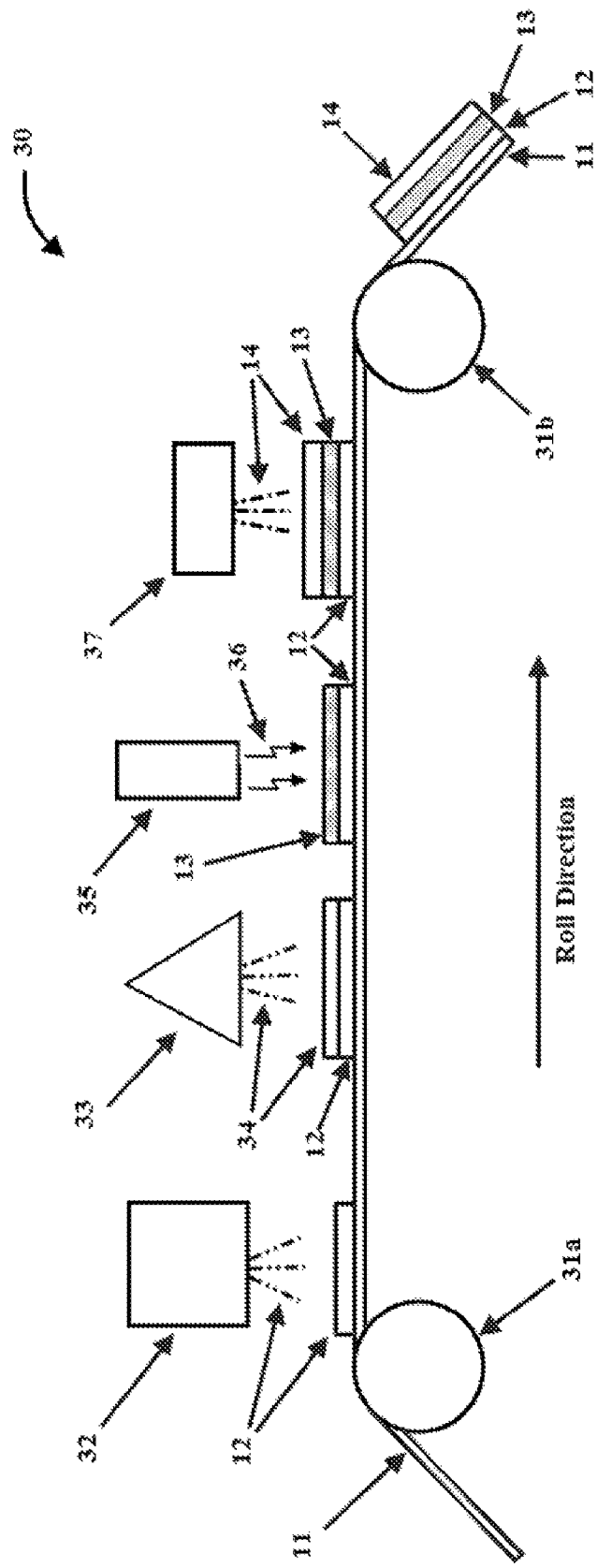
FIG. 3: Illustration of a roll-to-roll process that can be used to make ferroelectric materials, capacitors, thin film transistors, diodes etc., of the present invention.

Referring to FIG. 3, the ferroelectric precursor material (34) can be deposited by obtaining a solution or melt that includes a solvent and the ferroelectric polymer(s) solubilized therein. In certain instances, after deposition but prior to annealing, the deposited material (34) can slightly or substantially dry (e.g., solvent can begin the evaporation process) to create a semi-dry form. The solution or melt can be prepared in a common solvent which dissolves the polymers or melts the polymers into a blend. Non-limiting examples of such solvents include methyl ethyl ketone, di-methylformamide, acetone, di-methyl sulfoxide, cyclohexanone, tetrahydrofuran, diethyl carbonate, propylene glycol methyl ether acetate, etc. The solution can be deposited by spray coating, ultra sonic spray coating, roll-to-roll coating, ink jet printing, screen printing, drop casting, spin coating, dip coating, Mayer rod coating, gravure coating, slot die coating, doctor blade coating, extrusion coating, flexography, gravure, offset, rotary screen, flat screen, inkjet, roll-to-roll photolithography, or laser ablation. Alternatively, and as explained above, other processes such as melt blend extrusion can be used. FIG. 3. provides a non-limiting roll-to-roll system (30) that can be used to manufacture ferroelectric devices in the context of the present invention.

B. Roll-to-Roll Process for Producing Ferroelectric Capacitors and Thin Film Transistors Staying with FIG. 3, the roll-to-roll system (30) includes rollers (31a and 31b) that can be used to roll a substrate (11) material at a desired speed. The substrate (11) can be unrolled and placed on a first roller (31a) and then attached to a second roller 31(b) such that the substrate (11) moves from the first roller (31a) to the second roller (31b). Along the path, the system (30) can include various apparatuses for deposition of various materials. For instance, a back electrode (12) can be disposed onto the substrate (11) via any forms of deposition methods discussed above-deposition device is illustrated as (32). If needed, the back electrode (12) can be further processed (e.g., curing of the deposited back electrode (12)). After the back electrode (12) is deposited and processed onto the substrate (11), the precursor material (34) can be disposed onto at least a portion of the electrode surface (12) or the substrate (11) or both. In FIG. 3, the precursor material (34) is deposited on the electrode surface (12) via deposition device (33). The ferroelectric precursor material (34) can then be annealed with an oven or hot plates or other traditional heating sources. For example, the substrate (11)/back electrode (12)/ferroelectric precursor material (34) stack can be directly rolled to a device (35) that produces heat (36) such as standard rapid thermal annealing ovens. The device (35) can be used in combination with software to specifically control duration of heating and temperature of heating. The applied heat converts the precursor material (34) into the ferroelectric material having ferroelectric hysteresis properties (13), which is illustrated by the shaded area in (13) when compared with the unshaded lines in (34). This annealing step allows for the formulation of a crystalline phase (shaded portion in (13)) via chemical restricting of the precursor material (34) or removal of the solvent from said precursor material (34), or both. Subsequently, the substrate (11)/back electrode (12)/ferroelectric material (13) stack can be further processed by deposing a front electrode (14) onto at least a surface of the ferroelectric material (13) via a deposition device 37. The front electrode (14), if needed, can be further cured.

These described processes may allow efficiently production of high-performance ferroelectric capacitors (10), thin film transistors (20) or diodes (25) in large-scale quantities in a quick and cost efficient manner. However, although roll-to-roll processing is described above, other thin film manufacturing techniques may be used to manufacture the ferroelectric devices described herein.

C. Applications for Ferroelectric Capacitors and Thin Film Transistors

Any one of the ferroelectric capacitors, thin film transistors, or diodes of the present invention can be used in a wide array of technologies and devices including but not limited to: smartcards, RFID cards/tags, piezoelectric sensors, piezoelectric transducers, piezoelectric actuators, pyroelectric sensors, memory devices, non-volatile memory, stand-alone memory, firmware, microcontrollers, gyroscopes, acoustics sensors, actuators, microgenerators, power supply circuits, circuit coupling and decoupling, RF filtering, delay circuits, and RF tuners. If implemented in memory, including firmware, functions may be stored in the ferroelectric capacitors or thin film transistors as one or more instructions or code on a computer-readable medium. Examples include computer-readable media encoded with a data structure and computer-readable media encoded with a computer program. Computer-readable media includes physical computer storage media. Combinations of the above should also be included within the scope of computer-readable media.

In many of these applications thin films of ferroelectric materials are typically used, as this allows the field required to switch the polarization to be achieved with a moderate voltage. Although some specific circuitry has been set forth, it will be appreciated by those skilled in the art that not all of the disclosed circuitry is required to practice the disclosure. Moreover, certain well known circuits have not been described, to maintain focus on the disclosure.

Figure 4:
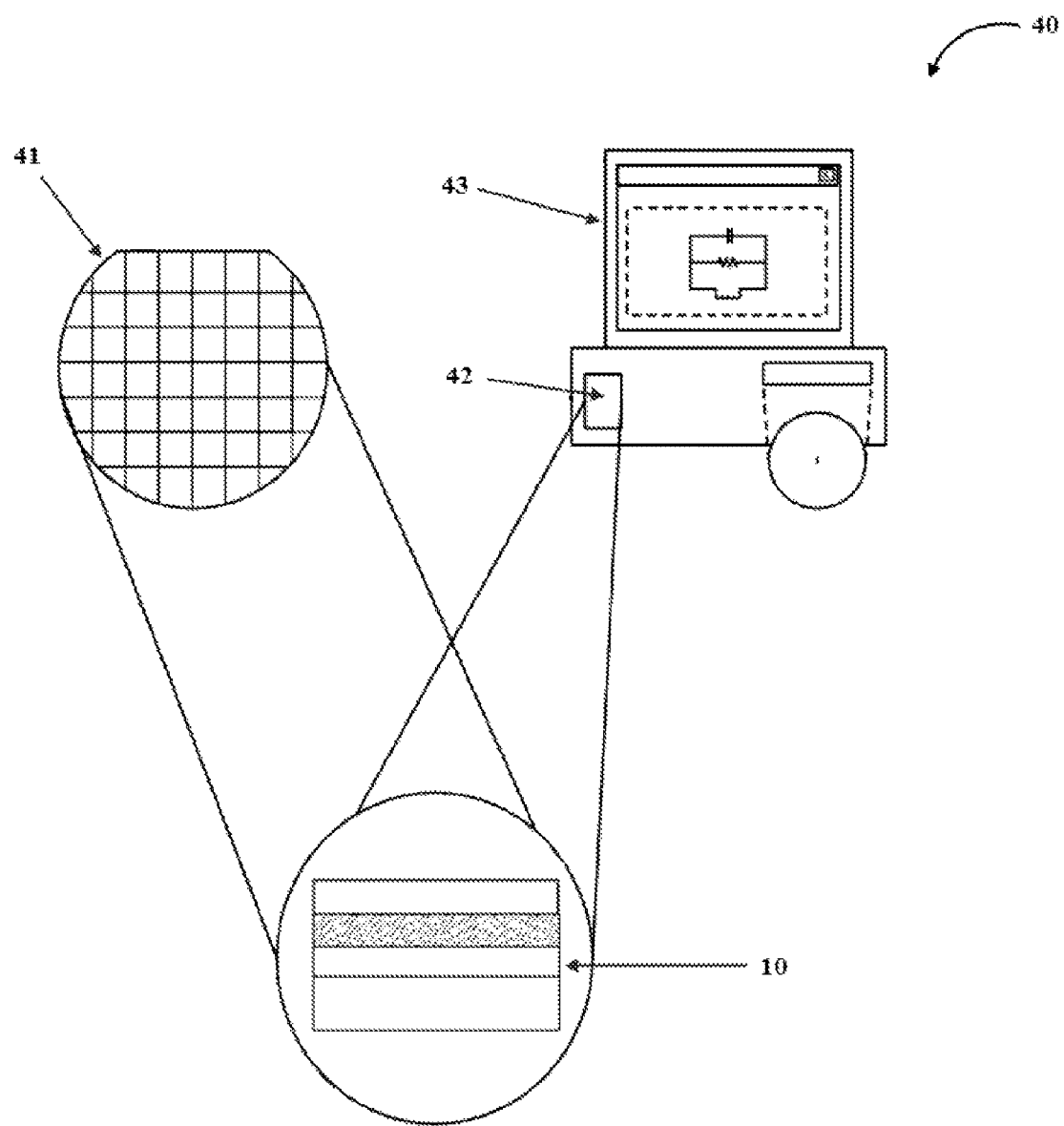
FIG. 4: Block diagram illustrating implementation of a circuit in a semiconductor wafer or an electronic device using ferroelectric capacitors, thin film transistors or diodes of the present invention.

FIG. 4 is block diagram illustrating implementation of an integrated circuit in a semiconductor wafer or an electronic device according to one embodiment. In one case, a ferroelectric capacitor (10) or thin film transistor (20) may be found in a wafer (41). Due to spatial restrictions, FIG. 4 references a ferroelectric capacitor (10). However, it should be recognized, that the thin film transistor (20) or ferroelectric diode (25) can replace the ferroelectric capacitor (10) or can be included/utilized along with said ferroelectric capacitor (10) in the electronic device illustrated in FIG. 4. The wafer (41) may be singulated into one or more dies that may contain the ferroelectric capacitor (10), thin film transistor (20) or diode (25). Additionally, the wafer (41) may experience further semiconductor manufacturing before singulation. For example, the wafer (41) may be bonded to a carrier wafer, a packaging bulk region, a second wafer, or transferred to another fabrication facility. Alternatively, an electronic device (43) such as, for example, a personal computer, may include a memory device (42) that includes the ferroelectric capacitor (10), thin film transistor (20) or diode (25). Additionally, other parts of the electronic device (43) may include the ferroelectric capacitor (10), thin film transistor (20) or diode (25) such as a central processing unit (CPU), a digital-to-analog converter (DAC), an analog-to-digital converter (ADC), a graphics processing unit (GPU), a microcontroller, or a communications controller.

Figure 5:
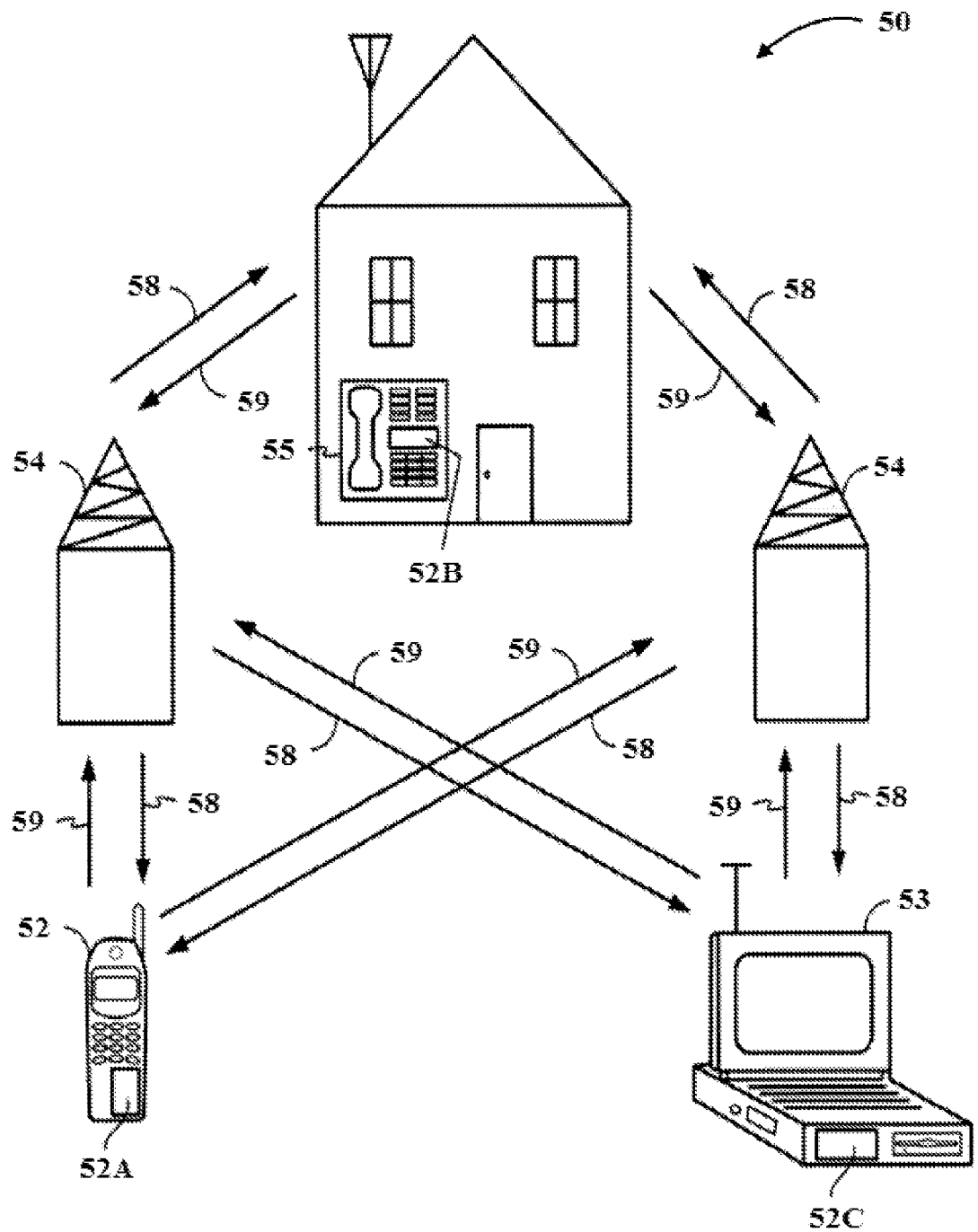
FIG. 5: Block diagram showing an exemplary wireless communication system in which the ferroelectric memory devices of the present invention may be advantageously employed.

FIG. 5 is a block diagram showing an exemplary wireless communication system (50) in which an embodiment of the disclosure may be advantageously employed. For purposes of illustration, FIG. 5 shows three remote units (52), (53), and (55) and two base stations (54). It will be recognized that wireless communication systems may have many more remote units and base stations. Remote units (52), (53), and (55) include circuit devices (52A), (52C) and (52B), which may comprise integrated circuits or printable circuit boards, that include the disclosed ferroelectric capacitor, thin film transistors or diodes made by the processes of the present invention. It will be recognized that any device containing an integrated circuit or printable circuit board may also include the ferroelectric capacitor, thin film transistor or diode disclosed herein, including the base stations, switching devices, and network equipment. FIG. 5 shows forward link signals (58) from the base station (54) to the remote units (52), (53), and (55) and reverse link signals (59) from the remote units (52), (53), and (55) to base stations (54).

In FIG. 5, remote unit (52) is shown as a mobile telephone, remote unit (53) is shown as a portable computer, and remote unit (55) is shown as a fixed location remote unit in a wireless local loop system. For example, the remote units may be mobile phones, hand-held personal communication systems (PCS) units, portable data units such as personal data assistants, GPS enabled devices, navigation devices, set upper boxes, music players, video players, entertainment units, fixed location data units such as meter reading equipment, or any other device that stores or retrieves data or computer instructions, or any combination thereof. Although FIG. 5 illustrates remote units according to the teachings of the disclosure, the disclosure is not limited to these exemplary illustrated units. Embodiments of the disclosure may be suitably employed in any device which includes the ferroelectric capacitor (10), thin film capacitor (20), or diode (25) made by the processes disclosed by the present invention.

D. Use of Ferroelectric Components as Multi-Level Memory Cells

Ferroelectric components, such as the ferroelectric field effect transistors (FeFETs) and ferroelectric capacitors and diodes described above, may be operated as multi-level memory cells as described by the present invention. Conventionally, a single ferroelectric component or device may store a single bit of information, e.g., '1' or '0.' This '1' or '0' value may be stored as a binary polarization direction of the ferroelectric layer in the ferroelectric component. For example, when the ferroelectric layer is polarized from top to bottom, the ferroelectric component stores a '1', and when the ferroelectric layer is polarized from bottom to top, the ferroelectric component stores a '0.' A multi-level memory cell (MLC) as disclosed in the present invention stores, in a single ferroelectric component, two or more bits of information, e.g., '00,' '01,' '10,' or '11' In one embodiment, the multiple bits of information may be represented by varying levels of polarization of the ferroelectric layer. That is, a highly polarized ferroelectric layer may represent '00,' a less polarized layer may represent '01,' a further reduced polarization layer may represent '10,' and a near zero or zero polarization layer may represent '11.' This mapping of polarization states is only one example. Different polarization levels may represent different bit combinations in different embodiments of the present invention.

Figure 6:
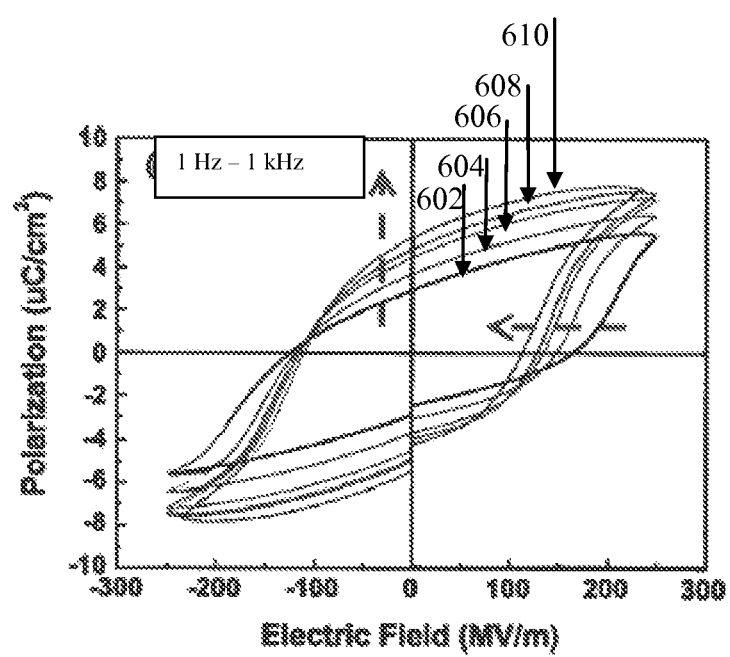
FIG. 6: Illustration of different polarizations of ferroelectric material obtained with different frequency of applied write signals of the present invention.

One method of obtaining different polarization levels within a ferroelectric layer of a ferroelectric component is by applying different frequencies for the electric pulse applied to the ferroelectric component during programming of the component. The varying characteristics of a ferroelectric component under application of different pulse frequencies is illustrated in FIG. 6. FIG. 6 is a graph illustrating a hysteresis loop for a ferroelectric component obtained at different pulse frequencies according to one embodiment of the present invention. The graph includes lines 602, 604, 606, 608, and 610 illustrating a hysteresis loop of a ferroelectric component at different pulse frequencies. Line 602 corresponds to a pulse frequency of 1 kHz, and line 610 corresponds to a pulse frequency of 1 Hz. The longer pulse time of the 1 Hertz signal causes a larger remnant polarization to exist on the ferroelectric layer. Thus, the stored electric field within the ferroelectric layer at zero applied field is larger for line 610 than line 602.

The varying levels of electric field stored in the ferroelectric material of the ferroelectric component change a channel resistance of the ferroelectric component, and thus change an I-V (current-voltage) characteristics of the ferroelectric component. The difference in channel resistance created by applying different pulse frequencies to the ferroelectric component may be measured to determine a state of the ferroelectric component. By manipulating the pulse frequency during programming of the ferroelectric component, the state of the ferroelectric component may be made to correspond to multiple bits of information.

Figure 7A:
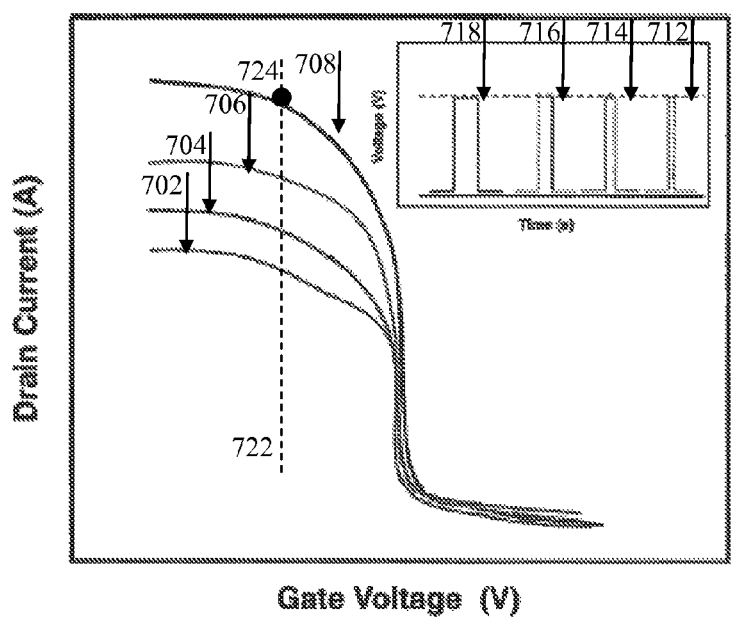
FIG. 7A: Illustration of various channel resistances that can be obtained with a ferroelectric transistor of the present invention based on different write pulse durations.

The different I-V characteristics of ferroelectric components programmed with different pulse frequencies is illustrated in FIG. 7A. FIG. 7A are graphs of I-V characteristics for ferroelectric transistor memory cells storing different bits of information according to one embodiment of the present invention. The graph of FIG. 7A includes lines 702, 704, 706, and 708 corresponding to expected response of a ferroelectric memory cell programmed by different pulse frequencies. Inset in the graph of FIG. 7A are write waveforms applied to the ferroelectric memory cell to obtain the different I-V characteristics of lines 702, 704, 706, and 708. For example, an applied pulse of line 718 may generate a remnant polarization within a ferroelectric memory cell that results in the I-V characteristic illustrated in line 708. Shorter pulses, from progressively higher frequency of operation, of lines 716, 714, and 712 may generate different polarizations within a ferroelectric memory cell resulting in the I-V characteristics illustrated in lines 706, 704, and 702, respectively.

Figure 7B:
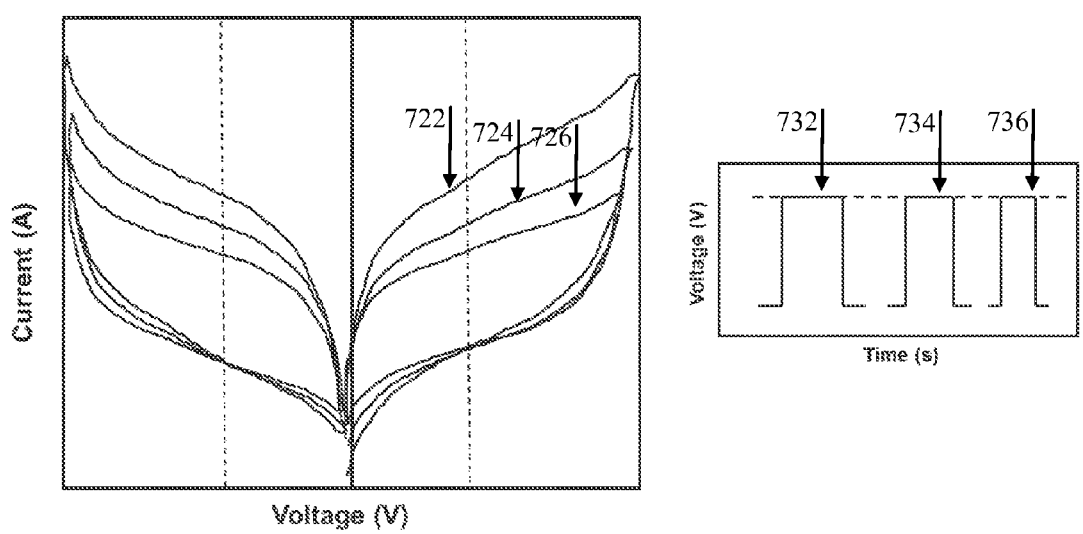
FIG. 7B: Illustration of various channel resistances that can be obtained with a ferroelectric diode of the present invention based on different write pulse durations.

The different I-V characteristics of ferroelectric components programmed with different pulse frequencies are further illustrated in FIG. 7B. FIG. 7B are graphs of I-V characteristics for ferroelectric diode memory cells storing different bits of information according to one embodiment of the present invention. The graph of FIG. 7B includes lines 722, 724, 726 corresponding to expected response of a ferroelectric memory cell programmed by different pulse frequencies. Inset in the graph of FIG. 7B are write waveforms applied to the ferroelectric memory cell to obtain the different I-V characteristics of lines 722, 724, and 726. For example, an applied pulse of line 736 may generate a remnant polarization within a ferroelectric memory cell that results in the I-V characteristic illustrated in line 726. Shorter pulses, from progressively higher frequency of operation, of lines 734 and 732 may generate different polarizations within a ferroelectric memory cell resulting in the I-V characteristics illustrated in lines 724 and 722, respectively.

Figures 8A, 8B, 8C, 8D:
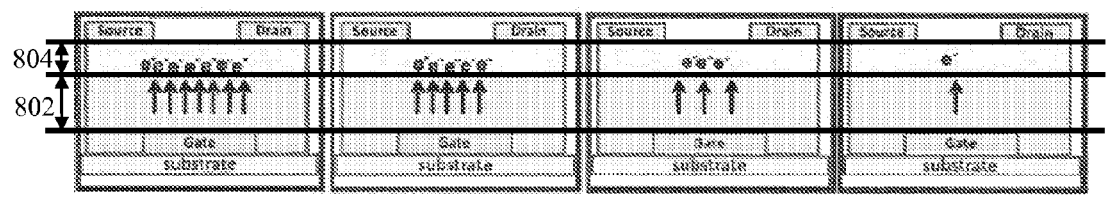
FIGS. 8A-D: Illustration of the effect of different write pulse durations on a ferroelectric memory cell of the present invention.

The different I-V characteristics of lines 702, 704, 706, and 708 of FIG. 7A and lines 722, 724, and 726 of FIG. 7B are the result of different channel resistances for the ferroelectric memory cell resulting from different remnant electric fields present in the ferroelectric layer of the ferroelectric memory cell. The change in channel resistance for different polarizations is illustrated in FIGS. 8A-D. FIG. 8A is an illustration of a ferroelectric memory cell corresponding to line 708 and line 718 of FIG. 7A. A long pulse duration of the applied write pulse results in a larger remnant electric field remaining in the ferroelectric layer 802 after application of the write pulse. The larger remnant electric field in ferroelectric layer 802 attracts electrons into the channel region 804 of the ferroelectric memory cell. The electrons in the channel region 804 increase a number of charge carriers within the channel region 804, which results in a decrease of the resistance of the ferroelectric memory cell. Illustrations of FIGS. 8B-D correspond to ferroelectric memory cells of lines 706, 704, and 702, respectively. Smaller remnant electric fields within the ferroelectric layers of FIGS. 8B-D, resulting from shorter write pulse durations of lines 716, 714, and 712, respectively, result in a decreased number of electrons in the channel regions 804. Thus, the channel resistance of the ferroelectric memory cell increases for each of lines 706, 704, and 702 due to a reduced number of available charge carriers in the channel.

Figure 9:
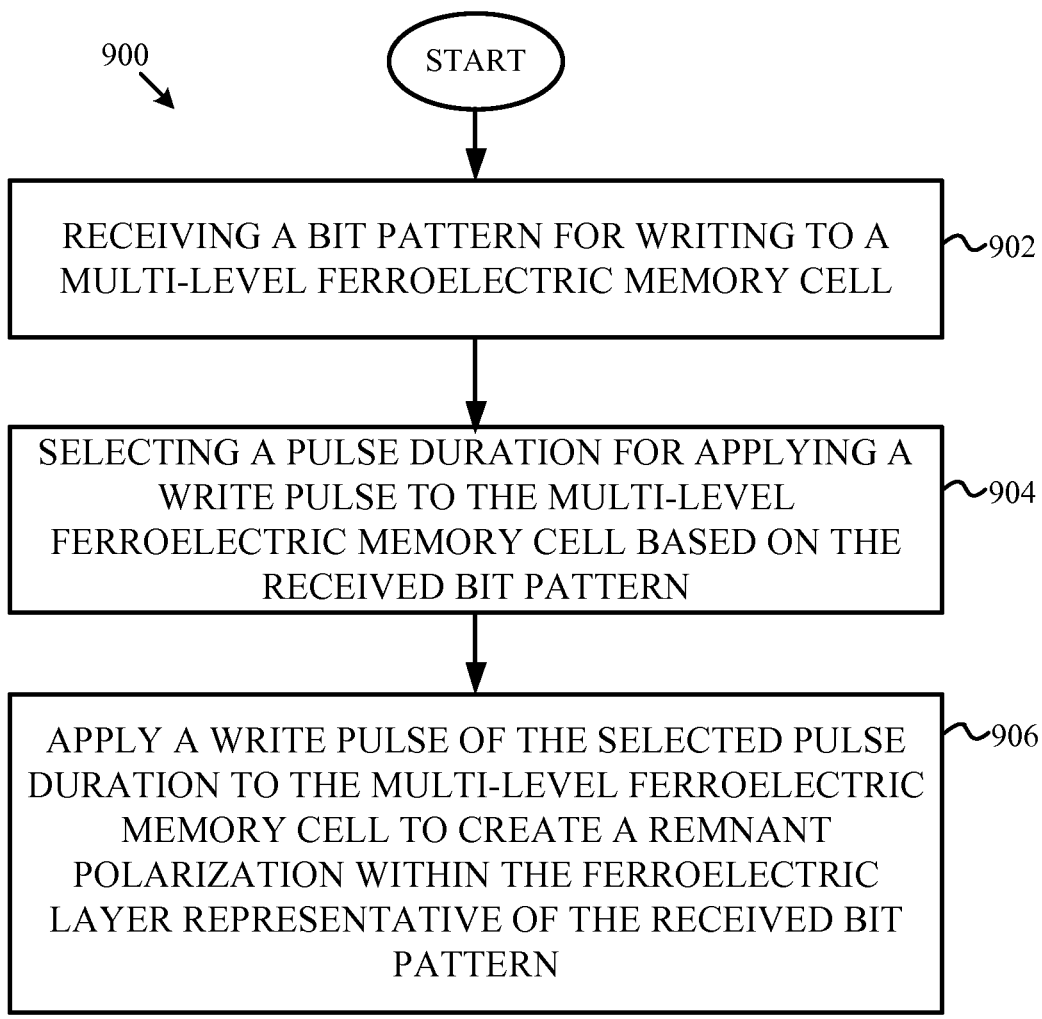
FIG. 9: Illustration of a method for writing multiple bits of information to a multi-level ferroelectric memory cell of the present invention.

E. Operation of a Controller for a Ferroelectric Memory Device for Storing Multiple Bits of Information in Memory Cells of the Ferroelectric Memory Device A ferroelectric memory device may be constructed with an array of the multi-level ferroelectric memory cells described above. Read and write operations to the ferroelectric memory device may be controlled by a memory controller coupled to the array of multi-level ferroelectric memory cells. One example of a write operation performed by the controller to store multiple bits of information in a single ferroelectric memory cell is shown in FIG. 9. Method 900 of FIG. 9 begins at block 902 with receiving a bit pattern for writing to a multi-level ferroelectric memory cell. The bit pattern may be, for example '01' or '010.' At block 904, a pulse duration may be selected for a write pulse to be applied to the ferroelectric memory cell. The pulse duration may be selected based, at least in part, on the bit pattern received at block 902. For example, as described above, the pulse duration may be selected to create a certain level of remnant polarization in the ferroelectric layer of the ferroelectric memory cell. That remnant polarization affects the channel resistance of the ferroelectric memory cell, which may be measured at a later time to retrieve the bit pattern corresponding to the channel resistance that was stored in the ferroelectric memory cell. Then, at block 906, a write pulse of the pulse duration selected at block 904 may be applied to the ferroelectric memory cell. The write pulse may create a remnant polarization within the ferroelectric layer corresponding to the received bit pattern at block 902. The cell programming at block 906 may also include other variations in the write pulse selected based on the received bit pattern of block 902. For example, block 906 may include generating multiple write pulses each with the selected pulse duration or a varying pulse duration. The frequency of application of these write pulses may be selected based on the received bit pattern at block 902.

Figure 10:
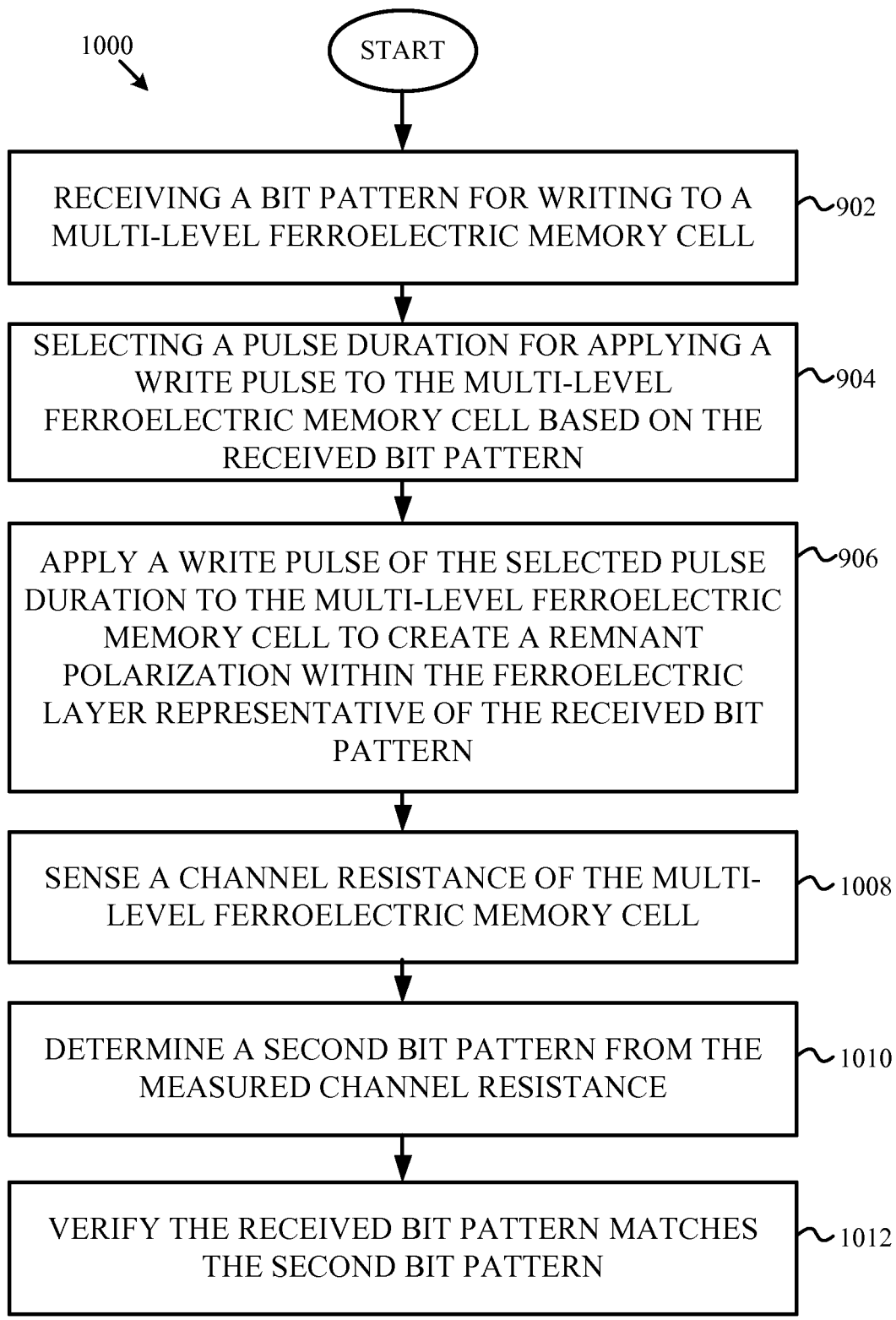
FIG. 10: Illustration of a method for writing, with verification, multiple bits of information to a multi-level ferroelectric memory cell of the present invention.

The controller may be configured to follow a write operation with a verify operation. The verify operation may be performed with select write, or all write, operations. One example of a write with verify operation is shown in FIG. 10. Method 1000 of FIG. 10 includes the write operation of blocks 902, 904, 906. Other write operations that store a bit pattern of more than two bits may be substituted for steps 902, 904, and 906 of FIG. 10. After the write operation of blocks 902, 904, and 906, a verify operation may be performed to ensure the correct bit pattern is stored in the multi-level ferroelectric memory cell. At block 1008, a channel resistance may be sensed of the multi-level ferroelectric memory cell. The channel resistance may be measured by applying a voltage between a source and a drain terminal of the ferroelectric memory cell and measuring a current flow through the ferroelectric memory cell. The measured current may be compared to reference values to determine a second bit pattern at block 1010, e.g., the bit pattern stored in the memory cell at block 906. For example, the measured current may be compared to known values of current at particular voltages as shown in FIG. 7. Referring back to FIG. 7, a line 722 illustrates different currents obtained at the same applied source-drain voltage for a ferroelectric memory cell programmed with different write pulses. When the ferroelectric memory cell is programmed with the write pulse of 718, a current 724 may be measured when the voltage of line 722 is applied across the drain and source terminals of the ferroelectric memory cell. Thus, at block 1012, the measured current value at block 1010 may be used to verify that the received bit pattern of block 902 matches the bit pattern stored in the ferroelectric memory cell at block 906. If the verify operation determines at block 1012 that an incorrect value is stored in the ferroelectric memory cell, the write operation of blocks 902, 904, and/or 906 may be repeated. When the verify operation at block 1012 determines the correct value is stored in the ferroelectric memory cell, the controller may proceed with the next operation.

Figure 11:
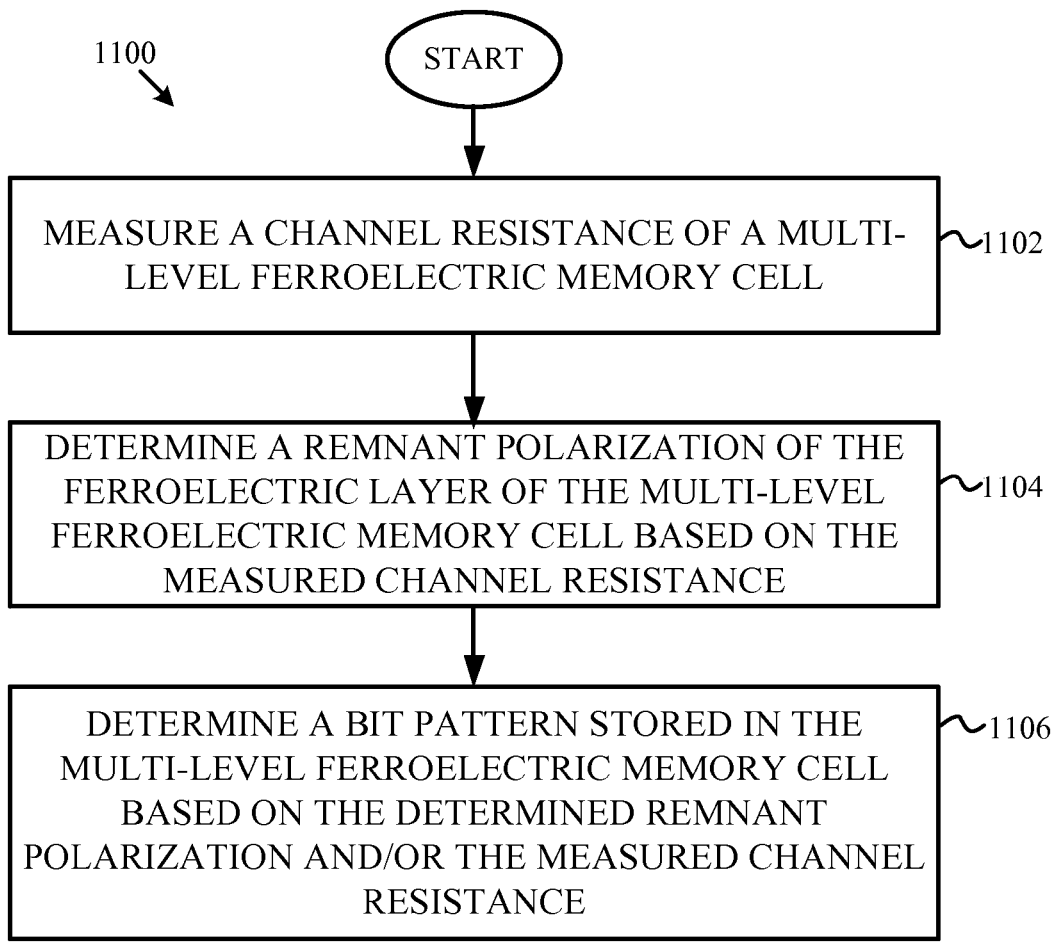
FIG. 11: Illustration of a method for reading multiple bits of information from a multi-level ferroelectric memory cell of the present invention.

A read operation may also be performed by the memory controller to obtain the bit pattern stored in the ferroelectric memory cell. The read operation may execute similar to the verify operation of blocks 1008, 1010, and 1012 of FIG. 10. One example of a read operation is shown in FIG. 11. Method 1100 begins at block 1102 with measuring a channel resistance of a multi-level ferroelectric memory cell. The channel resistance may be measured, for example, by applying a voltage across a drain and source terminal of the ferroelectric memory cell and measuring a current. The channel resistance may be calculated as approximately the applied voltage divided by the measured current from R=V/I. At block 1104, a remnant polarization of the ferroelectric layer of the multi-level ferroelectric memory cell may be determined based on the measured channel resistance of block 1102. Then, at block 1106, the bit pattern stored in the ferroelectric memory cell may be determined from the determined remnant polarization of block 1104 and/or the measured channel resistance of block 1102.

In an array of multi-level ferroelectric memory cells, the array may be interconnected by word lines extending across rows of memory cells and bit lines extending across columns of memory cells. The memory controller may operate the word lines and bit lines to select particular memory cells from the array for performing read and/or write operations.

Appropriate signals may then be applied to the word lines and bit lines to perform the desired read and/or write operation.

Figure 12:
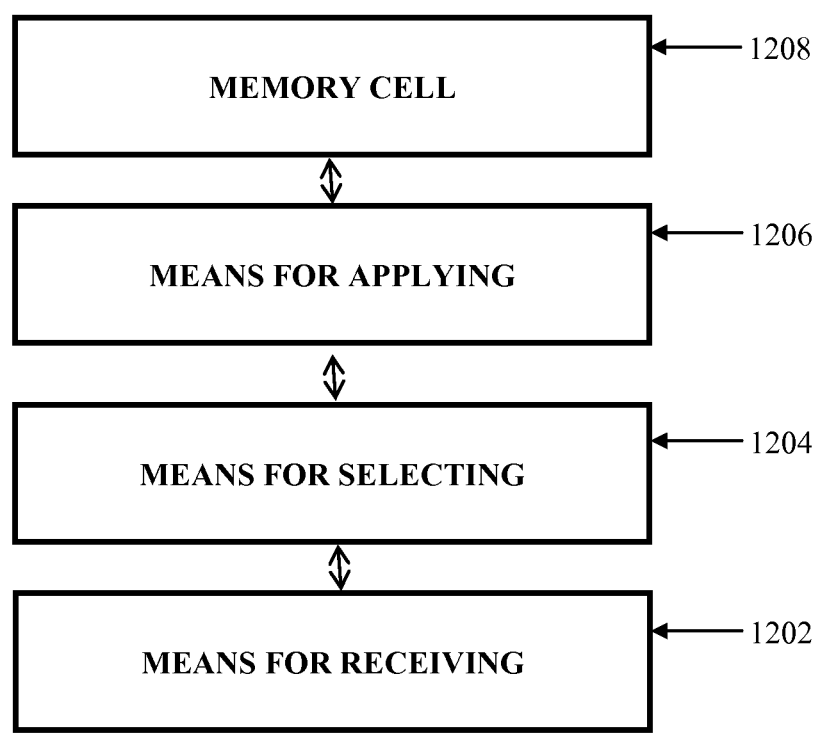
FIG. 12: Illustration of operation of a memory cell in one embodiment of the present invention.

In addition to operation of a memory cell by a controller as described above, the memory cell may be controlled by any device or circuitry. One general example for operation of a multi-level ferroelectric memory cell as described above is shown in the system diagram of FIG. 12. A memory cell 1208 may be coupled to a block 1206 including means for applying at least one write pulse to the memory cell having a selected pulse duration, in which the at least one write pulse creates a remnant polarization within the ferroelectric layer that is representative of the received bit pattern. The applying means of block 1206 may be coupled to block 1204 including means for selecting a pulse duration for applying a write pulse to the memory cell based, at least in part, on the received bit pattern. The applying means of block 1206 may include, for example, an amplifier configured to generate a signal of a desired voltage and be switched on and off for the pulse duration. The selecting means of block 1204 may be coupled to block 1202 including means for receiving a bit pattern for writing to the memory cell. The selecting means of block 1204 may be, for example, digital logic circuitry configured to select a pulse duration based on a received signal corresponding to the data to be stored in the memory cell. The receiving means of block 1202 may include, for example, an input node configured to receive a digital or analog signal. In one embodiment, the receiving means may include a buffering circuit and/or an impedance matching circuit coupled to the input node.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The invention claimed is:

1. A method for storing multiple bits of information in a multi-level ferroelectric memory cell, comprising:
   receiving a bit pattern for writing to a multi-level memory cell comprising a ferroelectric layer;
   selecting a pulse duration for applying a write pulse to the memory cell based, at least in part, on the received bit pattern;
   applying at least one write pulse to the memory cell having the selected pulse duration, in which the at least one write pulse creates a remnant polarization within the ferroelectric layer that is representative of the received bit pattern,
   wherein the ferroelectric multi-level memory cell is comprised of a ferroelectric capacitor or ferroelectric diode;

sensing a channel resistance of a second multi-level memory cell having a ferroelectric layer, wherein the second multi-level memory cell is the first multi-level memory cell;

determining a second bit pattern stored in the second multi-level memory cell based, at least in part, on the sensed resistance, wherein the sensed resistance of the second multi-level memory cell is representative of the remnant polarization of the ferroelectric layer; and verifying the determined second bit pattern is the received bit pattern.

2. The method of claim 1, in which the ferroelectric multi-level memory cell comprises the ferroelectric capacitor, and in which the step of applying the at least one write pulse to the memory cell comprises applying the at least one write pulse to the ferroelectric capacitor.

3. The method of claim 1, in which the ferroelectric multi-level memory cell comprises the ferroelectric diode, and in which the step of applying the at least one write pulse to the memory cell comprises applying the at least one write pulse to the ferroelectric diode.

4. The method of claim 3, in which the step of applying the at least one write pulse to the memory cell to create the remnant polarization within the ferroelectric layer comprises modifying a channel resistance between an upper and a lower electrode in the ferroelectric diode, wherein the channel resistance between the upper and the lower electrode is representative of the received bit pattern.

5. The method of claim 1, in which the step of applying the at least one write pulse to the memory cell comprises applying a plurality of write pulses to the memory cell at a frequency based, at least in part, on the received bit pattern.

6. An apparatus, comprising:
a) a memory cell comprising a ferroelectric capacitor or ferroelectric diode comprising:
an upper electrode;
a lower electrode;
a blend of ferroelectric and semiconducting material between lower and upper electrode; and
b) a controller coupled to the memory cell and configured to perform the steps of:
i. receiving a bit pattern for writing to the memory cell;
ii. selecting a pulse duration for applying a write pulse to the memory cell based, at least in part, on the received bit pattern;
iii. applying at least one write pulse to the memory cell having the selected pulse duration, in which the at least one write pulse creates a remnant polarization within the ferroelectric layer that is representative of the received bit pattern;
iv. detecting a current through the memory cell;
v. determining a bit pattern representative of the detected current
vi. verify the determined bit pattern is equal to the received bit pattern.

7. The apparatus of claim 6, in which the controller is configured to create a conduction path in the channel by applying the at least one write pulse to the memory cell based, at least in part, on the pulse duration of the at least one write pulse.

8. The apparatus of claim 6, in which the controller is configured to set a charge carrier level in the conduction channel by applying the at least one write pulse to the memory cell based, at least in part, on the pulse duration of the at least one write pulse.

9. The apparatus of claim 6, in which the controller is configured to receive at least two bits in the received bit pattern.

10. The apparatus of claim 6, in which the ferroelectric layer comprises an organic ferroelectric.

11. The apparatus of claim 6, in which the memory cell is one memory cell of an array of memory cells.

* * * * *